(12) United States Patent
Cananzi et al.

(10) Patent No.: US 11,510,338 B2
(45) Date of Patent: Nov. 22, 2022

(54) LOW TEMPERATURE THRESHOLD FAN GATING

(71) Applicant: Arista Networks, Inc., Santa Clara, CA (US)

(72) Inventors: David Anthony Cananzi, Santa Clara, CA (US); George Hong, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 701 days.

(21) Appl. No.: 16/265,917

(22) Filed: Feb. 1, 2019

(65) Prior Publication Data

US 2020/0253085 A1 Aug. 6, 2020

(51) Int. Cl.
*H05K 7/20* (2006.01)
*F04D 25/06* (2006.01)
*H02H 7/08* (2006.01)
*H02H 5/04* (2006.01)

(52) U.S. Cl.
CPC ......... *H05K 7/20209* (2013.01); *F04D 25/06* (2013.01); *H02H 5/04* (2013.01); *H02H 7/0833* (2013.01)

(58) Field of Classification Search
CPC .... H05K 7/20209; H02H 5/04; H02H 7/0833; H02H 7/08; F04D 25/06
See application file for complete search history.

(56) References Cited

U.S. PATENT DOCUMENTS

| 6,134,667 | A | 10/2000 | Suzuki et al. | |
|---|---|---|---|---|
| 2003/0193307 | A1* | 10/2003 | Burstein | F04D 27/008 318/473 |
| 2008/0170947 | A1 | 7/2008 | Sutardja | |
| 2008/0296017 | A1* | 12/2008 | Sonne | E21B 49/081 166/264 |
| 2010/0085196 | A1 | 4/2010 | Stiver et al. | |
| 2010/0290190 | A1* | 11/2010 | Chester | H05K 7/20772 361/701 |
| 2012/0010754 | A1 | 1/2012 | Matteson | |
| 2012/0218707 | A1 | 8/2012 | Chan | |
| 2013/0036754 | A1* | 2/2013 | Moore | F24F 3/14 62/126 |
| 2016/0192542 | A1 | 6/2016 | LeFebvre et al. | |
| 2017/0138628 | A1 | 5/2017 | Sondur et al. | |
| 2018/0003402 | A1 | 1/2018 | Lambert Grossi et al. | |
| 2018/0217005 | A1 | 8/2018 | Kanodia | |
| 2019/0191592 | A1* | 6/2019 | Liu | H05K 7/20209 |
| 2019/0213562 | A1* | 7/2019 | Fang | G01R 19/0092 |
| 2019/0361508 | A1 | 11/2019 | Yarragunta et al. | |
| 2020/0393882 | A1 | 12/2020 | Hanson et al. | |

OTHER PUBLICATIONS

U.S. Appl. No. 16/439,436, filed Jun. 12, 2019 (unpublished), 22 pages.

* cited by examiner

*Primary Examiner* — Adolf D Berhane
*Assistant Examiner* — Afework S Demisse
(74) *Attorney, Agent, or Firm* — Fountainhead Law Group P.C.

(57) ABSTRACT

A thermal management system is provided. The system includes a temperature sensor, a fan, an electronic circuit breaker (ECB) coupled to the fan to provide electric power to the fan. The system includes a controller coupled to the temperature sensor and the ECB, to direct the ECB to turn off the electric power to the fan responsive to detecting a temperature, from the temperature sensor less than a temperature threshold based on a temperature rating of the fan.

20 Claims, 5 Drawing Sheets

LOW TEMPERATURE THRESHOLD FAN GATING

BACKGROUND

Electronic equipment generates heat while in operation and is typically cooled with heatsinks and natural convection through venting or component exposure, or forced convection, for example, through a fan forcing airflow into or out of a chassis. Components must adhere to temperature operating characteristics. Fans are electro-mechanical components with specific operating conditions. The ball bearing lubricants for the rotator are particularly temperature sensitive and limit typical fan operating conditions, for example to 0° C. to 70° C. Operating, i.e. spinning, a fan below this temperature may stall the fan as the lubrication becomes too viscous. If a fan stalls, i.e., stops or greatly slows rotation with operation under these conditions, the fan's degradation accelerates and will decrease the mean time between failures.

Producers and users of industrial or extended operating temperature products typically face this problem. From a user standpoint, it is important to minimize fan maintenance and replacement. The conventional solution is to select lubricants and materials based on estimated operating conditions. To account for wider variations, more expensive lubricants and materials are often selected, which results in more expensive fans. In some situations, however, this still creates a trade-off between the low operating temperature and the high operating temperature. Producers recognize that certain customers demand reliability and must face a problem of providing reliability at economical costs. Therefore, there is a need in the art for a solution which overcomes the drawbacks described above.

SUMMARY

In some embodiments, a thermal management system is provided. The system includes a temperature sensor, a fan, an electronic circuit breaker (ECB) coupled to the fan to provide electric power to the fan. The system includes a controller coupled to the temperature sensor and the ECB, to direct the ECB to turn off the electric power to the fan responsive to detecting a temperature, from the temperature sensor less than a temperature threshold based on a temperature rating of the fan.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

An electronic system with thermal management is described herein to provide a solution to use fans for thermal management and electronic systems without exceeding operating temperature ratings for the fans, incurring low reliability or excessive costs for frequent fan replacement, or requiring exotic lubricants for fans. A temperature sensor and a controller that can turn off electric power to the fan(s) when temperature is below the lower operating limit for the fan protects the fan from operating below the specified temperature range and becoming damaged. It is noted that forced air cooling is generally not needed for the lower temperatures, where passive convection suffices to cool the system, and that turning off the power for the electric fan further protects the fan and extends the operating lifespan of the fan. Energy savings is a further benefit of such operation.

The solution in various embodiments provides a temperature sensor that can determine the ambient operating condition, logic, and a fan power gating mechanism. With this combination, a controller can discern whether the fan(s) should be on, or off, based on the ambient conditions. For instance, a fan rated for −20° C. (i.e., lower temperature limit) will not spin when the ambient conditions are less than −20° C. but the electronic components that are meant to be protected may be cooled passively from the relatively low ambient temperature. Once the controller determines from the temperature sensor that temperature is below a specified threshold, the controller can turn off power to fans, and as a result rotation ceases. Once the temperature rises, the controller restores power and the fans operate normally.

This solution takes advantage of the natural convection that a conventional system allows at low temperatures. For instance, at temperatures outside conventional fan operating ranges, such as −20° C., natural convection is sufficient to cool the majority of application specific integrated circuits (ASICs) systems. For mid-power ASIC room temperature, natural convection is enough. Therefore, in this range completely disabling the fans does not hamper the system's ability to cool because naturally cooling is sufficient. The result is a cooling system that uses fans when needed and preserves the fans when they are not needed. As a result, fans degrade less over time, and systems can operate at low temperature extremes without risking cooling component failures.

Some embodiments of the thermal management system use an analog temperature sensor with a settable threshold, a digital power manager (DPM) as the controller, and an electronic circuit breaker (ECB) for fan power gating. ECBs are typically used for fan power gating in, for example, products of the assignee. Present embodiments extend power gating to a low temperature threshold.

The embodiments allow forced air convection cooling in an extended (e.g., industrial) operating environment. Conventionally designed systems would generally either have more expensive fans, or natural convection cooling, i.e., no fans, requiring an overall environment to remain at much lower temperatures to protect the electrical components. As a result, the existing technology is either cost prohibitive, or limits the system's performance. Using fans only when they are needed allows building of a high-performance system for a wide variety of temperatures.

Figure 1:
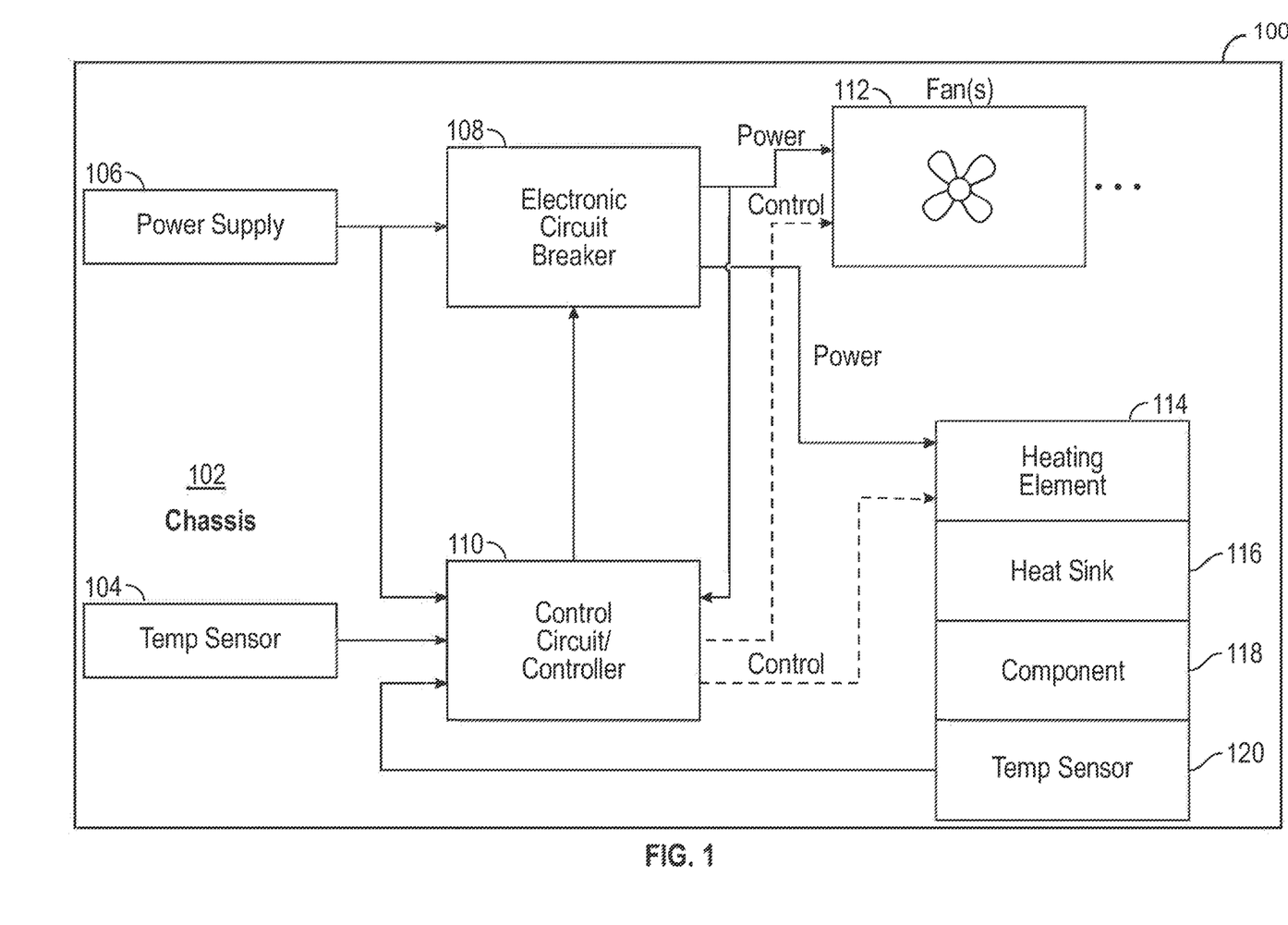
FIG. 1 is a block diagram of an electronic system with thermal management, in accordance with some embodiments.

FIG. 1 is a block diagram of an electronic system with thermal management, in accordance with an embodiment; electrical system 100 illustrated is generally comprised of chassis 102 housing the components of the system. Major components include Temperature sensor 104, one or more Fans 112, Electronic circuit breaker (ECB) 108, and Controller 110. Temperature sensor 104 determines the ambient temperature condition; typically, this will register a temperature inside chassis 102. ECB 108 functions as the fan's power switch and is controlled by controller 110, according to temperature determined from temperature sensor 104. In some versions, controller 110 controls fan speed of fan(s) 112 while power is supplied to fan(s) 112 from power supply 106 through ECB 108, according to temperature determined from temperature sensor 104. Also, in some versions, heating element 114 is supplied electrical power by ECB 108, as directed by controller 110. It should be appreciated that ECB 108 can represent one or more ECBs, or a multi-channel ECB.

Shown here, the heating element 114 is attached to the heatsink 116 of component 118, which also has component temperature sensor 120. Generally, component 118 is an electrical component, such as an ASIC, a general purpose central processing unit (CPU), or the like that operates—or operates more efficiently—within a general temperature range. It is recognized that other electrical components, like graphic processing units (GPUs) or similar, may also benefit from the teachings herein. In some embodiments, a top surface, a bottom surface, and/or the surface closest to the component, of heatsink 116 may be coated or galvanized with a resistive material and a current is applied to the material to generate heat and the heat is conducted through heatsink 116 to heat component 118. It should be appreciated that, in an embodiment, the heating element affixed to heatsink 116 may be utilized to supply heat to a component to assist with a "cold boot" or power up of the system. Controller 110 makes decisions about operation of the ECB 108, fan(s) 112, and/or heating element 114 based on temperature measured by the first temperature sensor 104, which measures ambient temperature inside the chassis 102, and/or the second temperature sensor 120, which measures temperature of a component 118 of interest. In some versions, controller 110 controls heating level of heating element 114 while power is supplied to heating element 114 from power supply 106 through ECB 108.

These and other components not shown are mounted in chassis 102 of FIG. 1. Further components for a full electronic system with various functionalities are readily devised according to the desired functionalities and system specifications, could include processors, communication components, analog circuits, digital circuits, optical components, etc. In variations, some of the components could be attached to chassis 102 or external to chassis 102, such as an external power supply 106.

Figure 2:
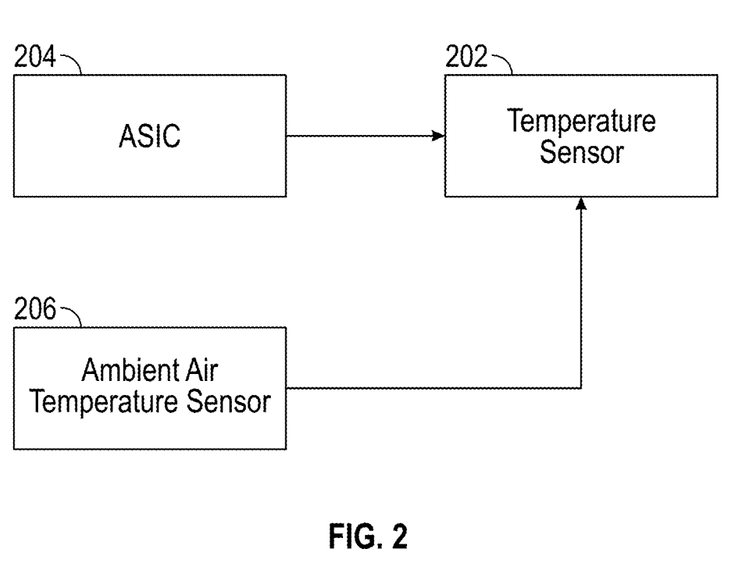
FIG. 2 is a block diagram of a temperature sensor for an embodiment of the electronic system of FIG. 1, in accordance with some embodiments.

FIG. 2 is a block diagram of a temperature sensor 202 for an embodiment of the electronic system of FIG. 1. Temperature sensor 202 has input from ambient air temperature sensor 206 and ASIC 204. Thus, temperature sensor 202 is a multi-channel temperature sensor that can detect ambient air temperature and also detect temperature of component 204. Sensors can be of various types, technologies and physical and electrical arrangement for various embodiments as readily devised in keeping with the teachings herein. In some embodiments, temperature sensor 202 may be an analog temperature sensor that does not require the computing system to be "on" or does not require firmware to operate. Thus, the controller may not be on and under extreme cold conditions the system described herein may heat the components to assist with a cold boot of the system. It should be appreciated that for robustness one version of the embodiments does not require software to be operating for temperature sensor 202 to function. In some embodiments, the system is hardware autonomous and the natural heating of the components can be utilized to assist in a cold boot and at the same time cold air is not pulled into the system as the power is cut off to the fan by the ECB.

Figure 3:
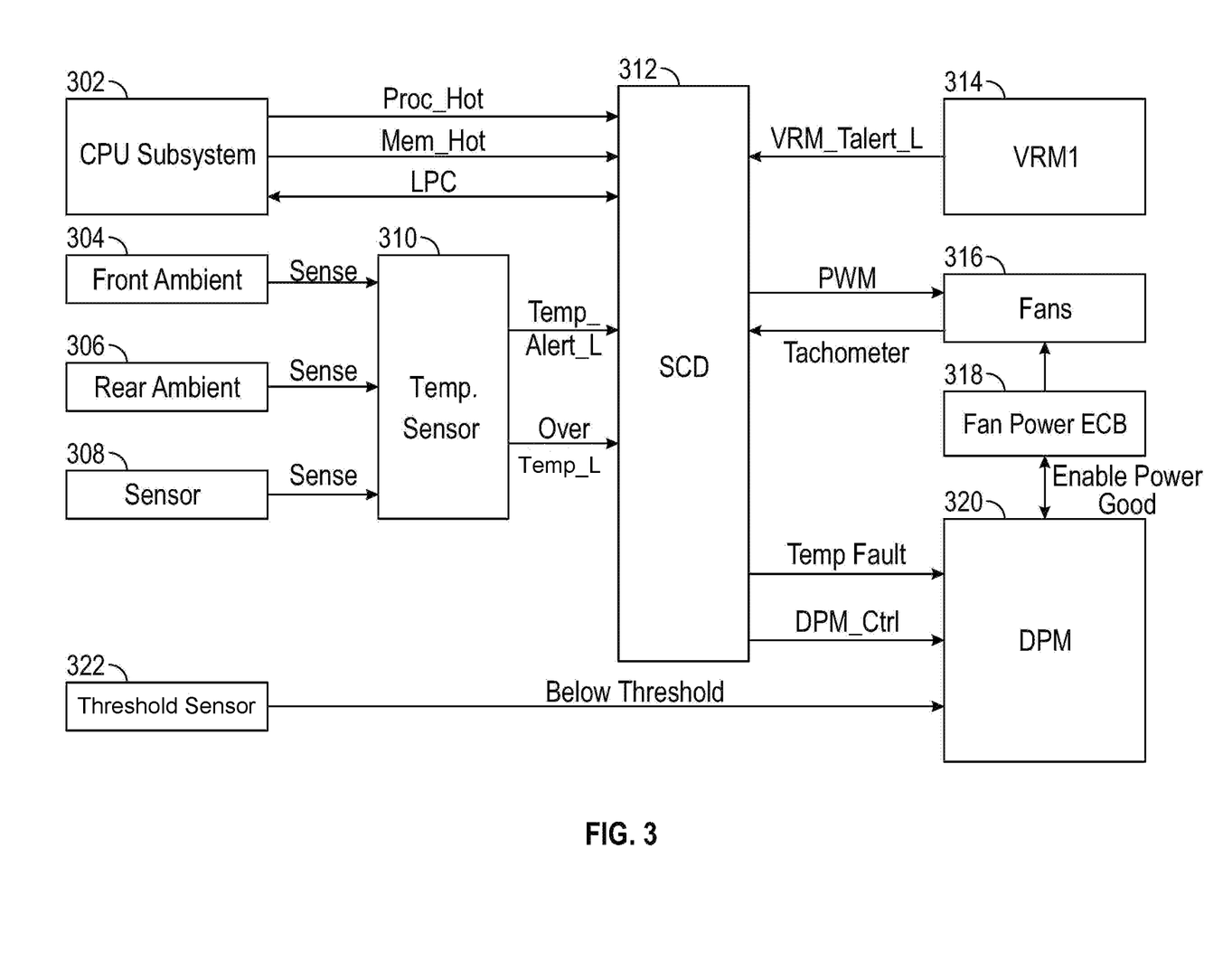
FIG. 3 is a further embodiment of the electronic system with thermal management, in accordance with some embodiments.

FIG. 3 is a further embodiment of an electronic system with thermal management. A CPU (central processing unit) subsystem 302 communicates with system control device (SCD) 312 and indicates whether the processor is hot (PROC_HOT signal), or the memory is hot (MEM_HOT signal). SCD 312 receives input from multi-channel temperature sensor 310, which in turn receives sense input from temperature sensors 304, 306, 308 labeled FRONT AMBIENT, REAR AMBIENT and any devices such as controllers, switches, etc. In one embodiment, the sensor 304 labeled FRONT AMBIENT is located at the front of chassis 102 to detect ambient temperature at the front of chassis 102. Sensor 306 labeled REAR AMBIENT, SENSOR is located at the rear of chassis 102 to detect ambient temperature at the rear of the chassis. Depending on fan location, for example, the front or rear could be closer to or farther from the fan(s). Sensor 308 labeled SENSOR is a variation of temperature sensor 120 attached to component 118 in FIG. 1, and detects temperature of a component in the system, e.g., a processor, controller, switch, etc. Based on these sense inputs, temperature sensor 310 communicates to SCD 312, indicating a temperature alert (TEMP_ALERT_L signal) and an over temperature condition (OVER TEMP_L signal). It should be appreciated that temperature sensor 310 communicates additional information, such as actual temperature data, etc.

SCD 312 communicates with a component 314 labeled (voltage regulator module) VRM1, which sends a temperature alert (VRM_TALERT_L signal), among other signals. SCD 312 communicates with fans 316, sending pulse width modulation signal labeled PWM to fans 316 to control speed of fans 316, and receiving a speed-indicating signal labeled TACHOMETER from the fans 316. With this information, SCD 312 controls the speed of the fans 316, when power is supplied to fans 316 by ECB 318 labeled FAN POWER ECB. As with FIG. 1 and the disclosure herein, fans 316 may only be one fan in an alternative embodiment.

SCD 312 communicates with digital power manager (DPM) 320, and sends signals for temperature fault and control to the DPM 320. With this information, DPM 320 communicates with ECB 318 with one or more signals (ENABLE signal and POWER GOOD signal). In one embodiment, DPM 320 monitors input and output of ECB 318, for example monitoring voltage and/or current into and out of ECB 318 (see FIG. 1). If a fault is detected, for example power into and out of ECB 318 differ by more than the threshold, or power out of the ECB is greater than expected for fans 316 (e.g., possibly indicating a short circuit or stalled fan), DPM 320 directs ECB 318 to turn off power to fans 316. Using information from temperature sensor 310, SCD 312 and DPM 320 directs ECB 318 to turn on or off power to fans 316. In some embodiments temperature sensor 310 is a multipoint temperature sensor as available from MAXIM INTEGRATED Inc.

Continuing with FIG. 3, DPM 320 also receives input from threshold sensor 322, a signal labeled BELOW THRESHOLD. In various embodiments, threshold sensor 322 is a temperature sensor and the signal is sense information indicating low temperature, below a threshold, for example below 0° C., below 20° C. or below −20° C., etc. Using information from the threshold sensor 322, the DPM 320 directs the ECB 318 to turn on or off power to the fans 316. Referring back to FIG. 1, SCD 312 and DPM 320 thus function in combination as an embodiment of controller 110. It should be appreciated that a controller can be implemented with one or multiple components in various embodiments, with a functionality of controlling other components or aspects of a system.

In some embodiments, the system may integrate auto-retries with regard to detecting faults. That is, after the system turns off electric power to fans 316, the system sets a timer and takes a timeout, then the system auto-retries. It should be appreciated that auto-retry involves turning on the electric power to the fans 316, through ECB 318, and trying again to test for a fault, keeping the electric power on if no fault is found, and turning the electric power off again if a fault is found as described further below. In variations, auto-retry is inside of a temperature testing loop, or outside of a temperature testing loop.

Figure 4:
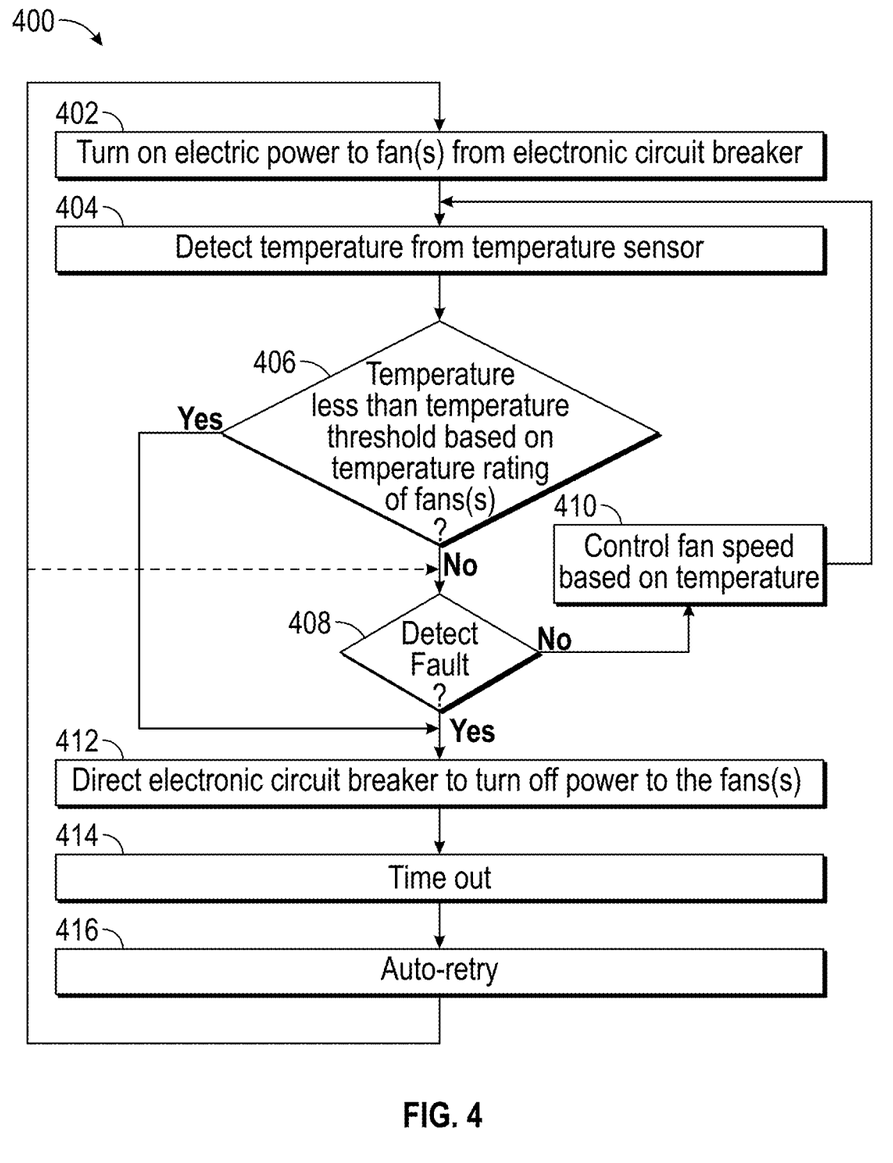
FIG. 4 is a flow diagram of a method of thermal management, which can be practiced by electronic systems described herein and variations thereof.

FIG. 4 is a flow diagram of a method of thermal management, which can be practiced by electronic systems described herein and variations thereof. More specifically, the method can be practiced by one or more controllers or other processors, firmware, hardware, or combinations thereof, in a thermal management system or electronic system with thermal management. In an action 402, electric power to one or more fans is turned on from an electronic circuit breaker. Electrical connections for an ECB and fans are shown in various embodiments and FIGS. 1 and 3, and variations thereof are readily developed. In an action 404, temperature is detected, from a temperature sensor. Various temperature sensors are depicted in FIGS. 1 and 3, and further embodiments are readily developed.

In an action 406 of FIG. 4, it is determined whether the temperature, from the temperature sensor, is less than a temperature threshold. The temperature threshold is based on temperature rating of the fan(s). For example, the temperature threshold could be the lower or minimum temperature specified in the operating temperature range of the fan, or that value guard banded by a specified amount. In this context, less than refers to colder temperatures than the temperature threshold. If the answer is yes, the temperature is less than the temperature threshold, flow proceeds to action 412, to turn off power to the fan(s). If the answer is no, the temperature is not less than the temperature threshold, flow proceeds to action 408.

In action 408, it is determined whether a fault is detected. The fault may be an electrical short in some embodiments. If the answer is no, no fault is detected, flow proceeds to action 410. In action 410, fan speed is controlled based on temperature. For example higher temperatures command higher fan speed, lower temperatures command lower fan speed. After action 410, flow proceeds back to the action 404, to again detect temperature from the temperature sensor. If the answer in the action 408 is yes, a fault is detected, flow proceeds to the action 412. In action 412, the system directs the electronic circuit breaker to turn off power to the fan(s). Turning off the power to the fans is in response to detecting a fault or detecting temperature less than the temperature threshold that is based on the temperature rating of the fan(s). Flow proceeds to the action 414.

In the action 414 of FIG. 4, there is a timeout. A timeout can be established and monitored through setting and reading a timer, or looping or branching elsewhere in system control flow, in various embodiments. In action 416, the system auto-retries. Flow proceeds back to action 402, to try turning on the electric power to the fan(s) and testing temperature and fault detection, or to action 408 to try detecting a fault, in various embodiments. Alternatively, flow could proceed to operation 404 to detect temperature before trying power or detecting a fault in some embodiments.

In variations of the depicted method, fault detection and temperature detection can be tried in differing orders, or in parallel. For example, the action 402, to turn on electric power to the fan(s) from the electronic circuit breaker, could be applied after testing temperature in the action 406 just prior to controlling the fan speed based on the temperature in the action 410, or after determining in the action 408 that there is no fault, in systems that can detect faults without power applied. Timeouts could be split and have different time lengths for power cut off due to temperature versus power cut off due to fault detection. Fault counting could be implemented to permanently turn off the fans until a component is replaced after a certain number of retries. Further variations of method are readily developed in keeping with the teachings herein. In some embodiments, the thermal management system is applied to a switch or network device, such as the network devices sold by the assignee.

Figure 5:
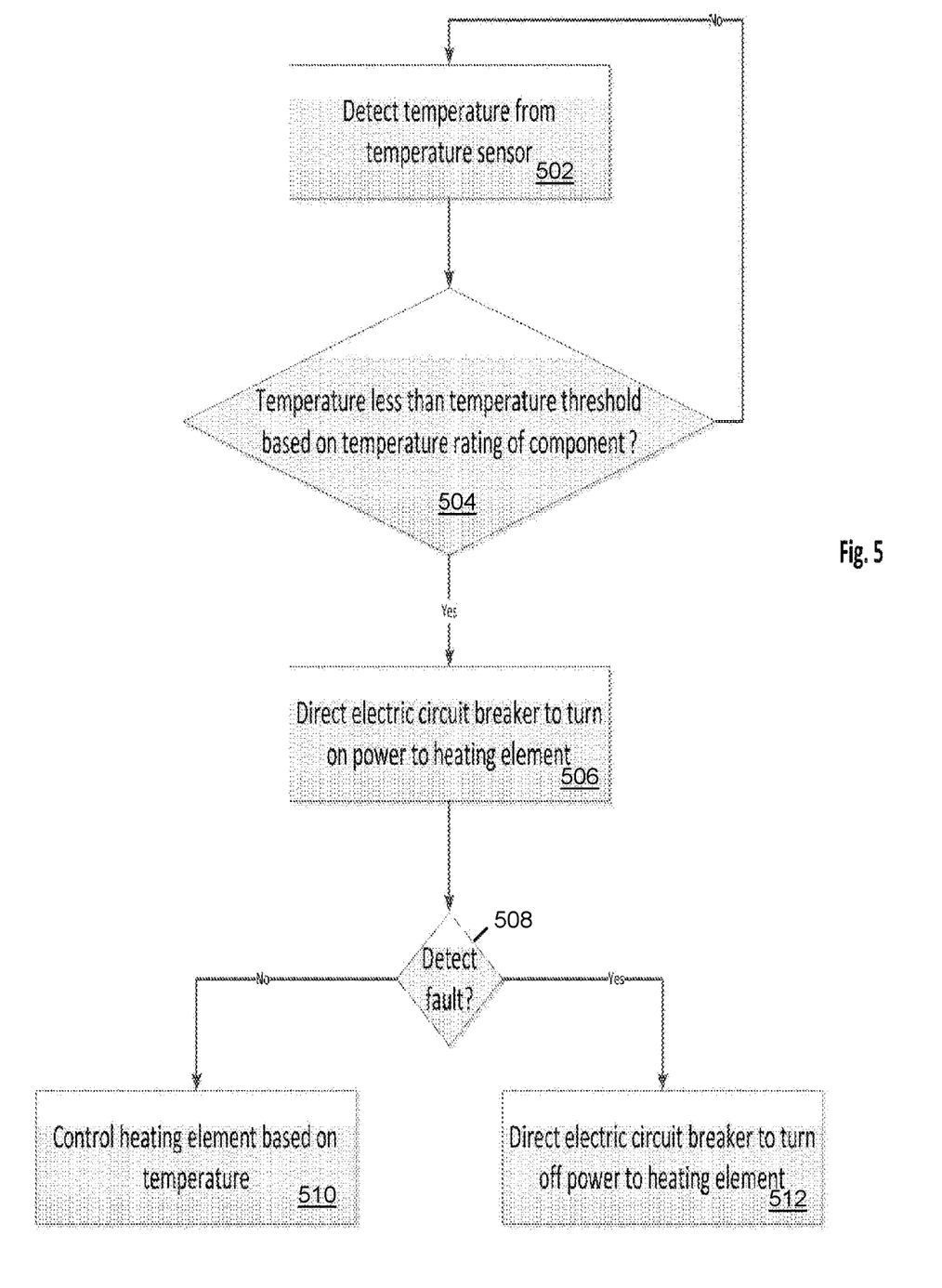
FIG. 5 is a flow diagram of a further method of thermal management, which can be practiced by electronic systems described herein and variations thereof.

FIG. 5 is a flow diagram of a further method of thermal management, which can be practiced by electronic systems described herein and variations thereof. As in the method shown in FIG. 4, the method can be practiced by one or more controllers or other processors, firmware, hardware, or combinations thereof, in a thermal management system or electronic system with thermal management. In an action 502, temperature is detected from a temperature sensor. Various temperature sensors are depicted in FIGS. 1 and 3, and further embodiments are readily developed.

In an action 504, it is determined whether the temperature is less than a temperature threshold that is based on a temperature rating of a component. For example, the temperature threshold could be the lower minimum temperature specified in the operating temperature range of the component, or that value guard banded by a specified amount. In this context, less than refers to colder temperatures than the temperature threshold. If the answer in the action 504 is yes, the temperature is less than the temperature threshold, flow proceeds to the action 506. If the answer in the action 504 is no, the temperature is not less than the temperature threshold, flow proceeds back to the action 502 in order to continue detecting temperature from the temperature sensor.

In action 506, the electronic circuit breaker is directed to turn on power to a heating element. Electrical connections for an ECB and heating element are shown in FIG. 1, and variations thereof are readily developed. In action 508, it is determined whether a fault is detected. If the answer in the action 508 is yes, a fault is detected, flow proceeds to the action 512. If the answer in the action 508 is that no fault is detected, flow proceeds to the action 510.

In action 510, the heating element is controlled based on temperature. For example, lower temperatures command increased heating, and higher temperatures command decreased heating. In some embodiments, the control of the heating element is coordinated with the control of one or more fans. For example, it could be arranged that fans are always off when heating is applied, and heating is always off when the fans are applied. Or, for very cold temperatures it could be arranged that fans are running at low speed to distribute heat, from the heating element(s), throughout an enclosure. Control can be extended to turning on and off power through the electronic circuit breaker, for fan(s) and heating element(s).

In the action 512, the electronic circuit breaker is directed to turn off power to the heating element, in response to detecting a fault in the action 508. In variations of the method shown in FIG. 5, the electronic circuit breaker could be directed to turn off power to the heating element when temperature is greater than the temperature threshold based on temperature rating of the component. Timeout and autoretry could be implemented, similar to the actions 414 and 416 of FIG. 4. In systems that can detect a fault without having power turned on to the heating element, the action 508 to detect a fault could be applied at other locations in the flow.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A thermal management system comprising:
    a temperature sensor to detect a temperature;
    a fan;
    an electronic circuit breaker (ECB) coupled to the fan to provide electric power to the fan; and
    a controller coupled to the temperature sensor and the ECB to direct the ECB to turn off the electric power to the fan responsive to detecting the temperature from the temperature sensor being less than a temperature threshold based on a temperature rating of the fan,
    wherein the temperature rating of the fan is defined by a range of temperatures over which the fan may operate that includes a lower operating temperature and an upper operating temperature, and wherein the controller is further configured to direct the ECB to turn off the electric power to the fan responsive to detecting the temperature is less than the temperature threshold where the temperature threshold is based on the lower operating temperature.

2. The thermal management system of claim 1, further comprising:
    a heating element coupled to the ECB; and wherein the controller is further configured to direct the ECB to apply the electric power to the heating element responsive to the detected temperature from the temperature sensor.

3. The thermal management system of claim 2, wherein the controller is configured to apply the electrical power to the heating element prior to powering up the thermal management system responsive to the detected temperature from the temperature sensor.

4. The thermal management system of claim 1, wherein the temperature sensor is configured to sense ambient air temperature and a temperature of a component in the thermal management system.

5. The thermal management system of claim 1, wherein the controller is further configured to monitor a voltage or a current into and out of the ECB, and to direct the ECB to turn off the electric power to the fan responsive to detecting an anomaly in the voltage or current into and out of the ECB.

6. The thermal management system of claim 1, wherein the temperature threshold is equal to the lower operating temperature plus or minus a guard band value.

7. An electronic system with thermal management, comprising:
a chassis;
a plurality of electronic components in the chassis;
a temperature sensor in the chassis;
a fan mounted to the chassis to direct airflow for cooling at least one of the plurality of electronic components;
an electronic circuit breaker (ECB) coupled to a power supply and to the fan to supply electric power from the power supply to the fan; and
a controller coupled to the temperature sensor and the ECB and configured to:
determine a temperature from the temperature sensor;
compare the determined temperature to a temperature threshold based on a lower operating limit temperature rating of the fan; and
direct the ECB to turn off the electric power to the fan when the temperature from the temperature sensor is less than the temperature threshold.

8. The electronic system with thermal management of claim 7, wherein the controller is further configured to:
detect a fault;
direct the ECB to turn off the electric power to the fan responsive to detecting the fault; and
auto-retry directing the ECB to turn on the electric power to the fan; and
determining whether the fault is still present.

9. The electronic system with thermal management of claim 7, wherein the controller is further configured to control speed of the fan responsive to the determined temperature from the temperature sensor.

10. The electronic system with thermal management of claim 7, further comprising:
a heating element attached to a heatsink of one of the plurality of electronic components; and
wherein the controller is further configured to direct the ECB to control the electric power to the heating element responsive to the temperature sensor.

11. The electronic system with thermal management of claim 7, wherein the lower operating limit temperature rating is defined by a lower operating temperature of a range of temperatures over which the fan may operate, the range also being defined by an upper operating temperature.

12. The electronic system with thermal management of claim 7, wherein the lower operating limit temperature rating of the fan is based on a temperature range of a lubricant in the fan.

13. The electronic system with thermal management of claim 7, wherein the temperature threshold is equal to the lower operating limit temperature rating of the fan plus or minus a guard band value.

14. A method of thermal management, comprising:
supplying electric power to a fan from an electronic circuit breaker (ECB), the fan circulating air to cool one or more electronic components;
detecting temperature from a temperature sensor; and
directing the ECB to turn off the electric power to the fan to enter a passive cooling mode responsive to determining the temperature from the temperature sensor is less than a temperature threshold, wherein the temperature threshold is based on a temperature rating of the fan,
wherein the temperature rating of the fan is defined by a range of temperatures over which the fan may operate that includes a lower operating temperature and an upper operating temperature, and wherein directing the ECB to turn off the electric power to the fan to enter the passive cooling mode comprises determining the temperature from the temperature sensor is less than the temperature threshold where the temperature threshold is based on the lower operating temperature.

15. The method of claim 14, further comprising:
detecting a fault; and
directing the ECB to turn off the electric power to the fan responsive to the detecting the fault.

16. The method of claim 14, further comprising:
directing the ECB to turn on the electric power to a heating element responsive to determining the temperature from the temperature sensor is less than a further temperature threshold, wherein the further temperature threshold is based on a temperature rating of an electronic component.

17. The method of claim 14, further comprising:
detecting temperature of an electronic component from a further temperature sensor; and
determining whether to control fan speed or direct the ECB to turn on or off the electric power to the fan based on the detected temperature of the electronic component.

18. The method of claim 14, further comprising:
monitoring a voltage or a current into and out of the ECB; and
directing the ECB to turn off the electric power to the fan responsive to detecting an anomaly in the voltage or current into and out of the ECB.

19. The method of claim 14, further comprising:
detecting a fault relating to the fan;
directing the ECB to turn off the electric power to the fan responsive to the detecting the fault; and
auto-retrying providing power to the fan by directing the ECB to turn on the electric power to the fan and testing for the fault in the fan.

20. The method of claim 14, wherein the temperature threshold is equal to the lower operating temperature plus or minus a guard band value.

* * * * *